Nov. 26, 1968 D. I. POMERANTZ 3,412,788
SEMICONDUCTOR DEVICE PACKAGE
Filed March 11, 1966

INVENTOR
DANIEL I. POMERANTZ
BY
ATTORNEY

United States Patent Office 3,412,788
Patented Nov. 26, 1968

3,412,788

SEMICONDUCTOR DEVICE PACKAGE

Daniel I. Pomerantz, Lexington, Mass., assignor to P. R. Mallory & Co., Inc., Indianapolis, Ind., a corporation of Delaware Filed Mar. 11, 1966, Ser. No. 533,646
10 Claims. (Cl. 165—185)

ABSTRACT OF THE DISCLOSURE

The combination of semiconductor means including a substantially threadless housing means and snap-on heat sink means which substantially locks with the threadless housing thereby retaining the semiconductor means and heat sink means in intimate cooperative relationship.

The present invention relates generally to means and methods for efficiently and effectively cooling electrical components such as semiconductors and the like. More particularly, the present invention relates to a snap-on heat sink which provides a secure spring lock against the smooth surfaces of a cup-like housing used to retain a semiconductor. The snap-on heat sink eliminates the necessity of costly machining of the semiconductor housing in order to provide a means such as, for example, threads for firmly coupling the heat sink to the housing.

It is well known that semiconductors generate heat during operation. Therefore, if the semiconductor did not make use of a heat sink to dissipate heat during its operation, the semiconductor would generate sufficient heat which would prevent it from functioning properly or generate sufficient heat which would destroy the semiconductor. The snap-on heat sink dissipates the correct amount of heat generated by the semiconductor by convection and radiation thereby allowing it to retain its established electrical characteristics.

Accordingly, it is an object of the present invention to provide a snap-on heat sink which locks with an unthreaded housing of a semiconductor so as to lock the semiconductor and heat sink in initimate thermal cooperative relationship.

Another object of the present invention is to provide a snap-on heat sink wherein the fastener means thereof provides two separate and distinct forces to double spring lock the heat sink to the husing of the semiconductor.

Still another object of the present invention is to provide a cup-shaped housing that is a self-contained mold for retaining a semiconductor wafer and covering insulative material.

A further object of the present invention is to provide a semiconductor having an unthreaded housing with a snap-on heat sink wherein the heat sink can be coupled to or removed from the housing of the semiconductor easily and conveniently.

Another object of the present invention is to provide a semiconductor with a snap-on heat sink wherein the heat sink is shaped to optimize the electrical characteristics of the semiconductor by conducting the correct amount of heat away from the semiconductor.

Yet another object of the present invention is to provide a semiconductor with a snap-on heat sink that is characterized by its accuracy of operation, yet inexpensive and simple to manufacture.

Still another object of the present invention is to provide a semiconductor with a snap-on heat sink of specific physical configuration, yet of sturdy construction.

A further object of the present invention is to provide a snap-on means that functions as a heat sink to reduce the temperature of the held component.

Yet another object of the present invention is to provide a semiconductor with a snap-on heat sink that is integrally locked with the semiconductor so as to prevent movement of the semiconductor with respect to the heat sink due to abusive handling.

The present invention, in another of its aspects, relates to novel features of the instrumentalities described herein for teaching the principal object of the invention and to the novel principles employed in the instrumentalities whether or not these features and principles may be used in the said object and/or in the said field.

With the aforementioned objects enumerated, other objects will be apparent to those persons possessing ordinary skill in the art. Also, other objects will appear in the following description, appended claims, and appended drawings. The invention resides in the novel construction, combination, arrangement, and cooperation of elements as hereinafter described and more particularly as defined in the appended claims.

The appended drawings illustrate the present invention constructed to function for the practical application of the basic principles involved in the hereinafter described invention.

Generally speaking, the present invention relates to a heat sink means that can be easily and conveniently attached to or removed from a semiconductor structure having a threadless housing with an arched flange. The heat sink comprises a strip of metal and a fastener means. The strip of metal is contoured around and is in thermal engagement with the arched flange of the housing of the semiconductor structure. The strip of metal is used for conducting heat away from the semiconductor by convection and radiation. The fastener means double locks the strip of metal into thermal engagement with the arched flange of the housing.The fastener means includes a normally arched base that compressively biases the strip of metal into engagement with the flange of the housing so as to substantially flatten the flange. The fastener means also includes a plurality of arched tangs that engage and lock with the threadless surfaces of the housing thereby inwardly locking the fastener to the housing and further compressively biasing the strip of metal into thermal engagement with the flange.

Figure 1:
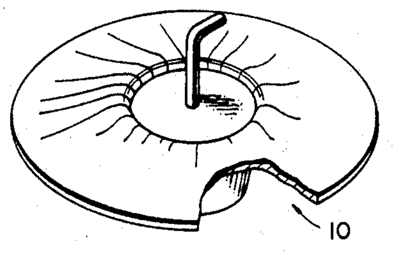
FIGURE 1 is a perspective view of a semiconductor contained within a cup-shaped housing having a circular flange.
Figure 2:
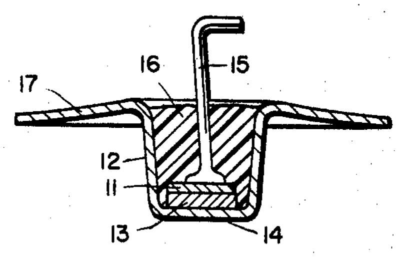
FIGURE 2 is a cross-sectional view taken across the lines 2—2 of FIGURE 1.

Referring now to FIGURES 1 and 2, there is shown a semiconductor structure 10. A semiconductor wafer 11 is fabricated from any suitable material such as germanium, silicon or the like and is attached to the flat extremity 14 of a cup-shaped housing 12 by any suitable material such as by solder 13. It is seen that the solder serves to fixedly retain the wafer on the flat extremity and also serves to electrically connect the wafer to the cup-shaped housing. An electrically conductive lead 15 is afixed to the major surface of the wafer thereby forming a contact. The outer surface of the flat extremity of the cup-shaped housing may serve as the other conductive lead to the semiconductor device or another conductive lead (not shown) may be soldered to the outer extremity of the cup-shaped housing. The wafer 11 is completely covered by any suitable insulative material such as epoxy resin 16. The epoxy resin coating over the wafer serves to protect the wafer from humidity, dust or other like contaminates. The epoxy resin also serves to protect the wafer from shock and vibration. It should be noted that the cup-shaped portion of the housing acts as a seat for the semiconductor wafer and also acts as a self-contained mold for the epoxy resin covering the wafer. The circular flange 17 of the cup-shaped housing is resilient and extends radially from the axis of the housing. The flange of the housing is arched slightly downward. The housing is fabricated from any suitable heat conductive and resilient material such as aluminum, copper and the like. It should be noted that the arched flange would serve as a means for dissipating heat generated by the semiconductor wafer.

Figure 3:
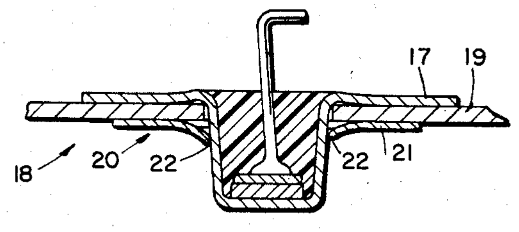
FIGURE 3 is a semiconductor and its housing including a snap-on heat sink double locked with the unthreaded housing of the semiconductor.

FIGURE 3 illustrates a snap-on heat sink 18 in a double locked position with the cup-shaped housing of the semiconductor. The snap-on heat sink may include two separate and distinct components as shown in FIGURE 3. As illustrated in FIGURE 3, an apertured strip of metal 19 is firmly biased against the circular flange of the cup-shaped housing by a push-on fastener means 20 so as to be in intimate thermal contact therewith. The strip of metal 19 is fabricated from any good heat conducting material such as aluminum, copper or the like. The fastener means is fabricated from a resilient material such as spring steel or the like. The fastener means is used to bias the strip of metal toward the circular flange in such a fashion that the strip of metal is positively biased against the flange with a force sufficient to substantially flatten the flange. It is seen that the strip of metal is biased into thermal engagement with the subjacent surface of the flange. It will be noted that the maximum possible area of the strip of metal of the heat sink is in thermal engagement with the maximum possible area of the under surface of the circular flange. The size of the flange and the size of the strip of metal of the heat sink are determined by the heat conductive properties of the material and in general must be varied to assure correct heat flow from the semiconductor.

Figure 6:
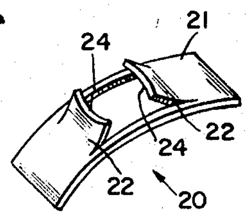
FIGURE 6 is a perspective view showing the arch of the base and the tangs of the fastener.

The fastener means portion of the snap-on heat sink includes a normally arched base 21 and normally arched tangs 22 as shown in FIGURE 6. The fastener means utilizes the principle of spring tension fastening. It will be noted that two separate and distinct forces are utilized to double lock the strip of metal of the heat sink in intimate thermal contact with the flange as the fastener means is pressed over the cup-shaped portion of the housing. These two separate and distinct forces are the inward housing lock and the arched spring lock. The inward housing lock is provided by inward engagement of the plurality of inwardly biased arched tangs with the smooth surface of the cup portion, thereby engaging and locking against the outer walls of the cup-shaped housing. The tangs are oppositely spaced and each tang includes a notch 24 that mates with the contour of the housing. The resilient tangs compensate for variations in the surface of the cup-shaped housing. The arched spring lock is provided by the compression of the arch in both tangs and in the base as the fastener means is advanced toward the strip of metal. This resultant action provides a strong downwardly acting thrust against the cup-shaped housing and the flange thereof that is sufficient to flatten the arch in the flange of the cup-shaped housing. It will be noted that the tangs of the fastener are in positive engagement with the smooth surfaces of the cup-shaped housing.

Figure 4:
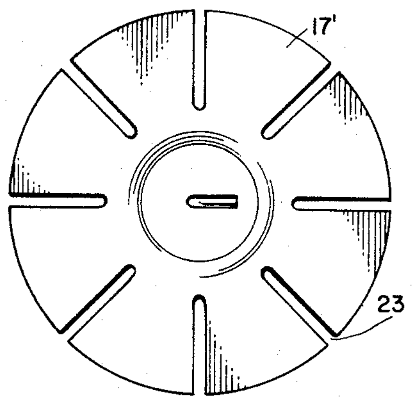
FIGURE 4 is a top view of a semiconductor contained within a cup-shaped housing having a slotted circular flange.

FIGURE 4 illustrates a flange 17' of the cup-shaped housing that includes a plurality of slots 23 radially extending to the periphery of the flange. The slots are illustrated as being equally spaced apart. This construction permits each segment between adjacent slots to separately biased against the strip of metal of the heat sink. The assembly of the semiconductor and the heat sink is accomplished as before, that is, the aperture in the strip of metal is brought into mating engagement with the cup portion of the housing of the semiconductor and the fastener is pressed over the outer surfaces of the cup and move the strip of metal into intimate thermal contact with the slotted flange. It will be noted that each of the areas of the flange between adjacent slots is individually biased against the strip of metal. Individual spring biasing of each segment of the flange more fully compensates for inconsistencies in the flange such as high areas, depressions and the like. Likewise, the individual spring biasing of each segment of the flange also compensates for inconsistencies in the heat sink.

Figure 5:
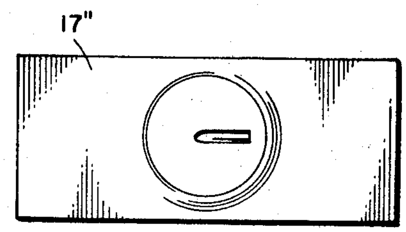
FIGURE 5 is a top view of a semiconductor contained within a cup-shaped housing having a rectangular flange.

FIGURE 5 shows a cup-shaped housing having a rectangular flange 17'' which can be assembled with an integral heat sink in the manner explained in conjunction with FIGURES 3 and 4.

While the invention is described with reference to a specific means and method, it will be understood that modifications and variations may be made in the disclosure by those skilled in the art without departing from the spirit and the scope of the novel concepts of this invention. Such modifications and variations are considered to be within the purview and the scope of the invention and the appended claims.

Having thus described my invention, I claim:

1. In combination, semiconductor means carried by housing means having an arched flange, and snap-on means for conducting heat away from said semiconductor means, said snap-on means including a strip of heat conductive metal contoured around and in thermal engagement with and extending beyond said flange of said housing, and fastener means for retaining said strip of metal in thermal engagement with said flange, said fastener means including a base biasing said strip of metal into engagement with said flange so as to substantially flatten said flange and a plurality of tangs engaging and locking with said housing thereby locking said snap-on means to said housing and further biasing said strip of metal into thermal engagement with said flange.

2. The snap-on means of claim 1, wherein said base is normally arched so as to compressively bias said strip into engagement with said flange and said tangs are normally arched so as to inwardly lock said fastener to said housing and further compressively bias said strip of metal toward said flange.

3. The snap-on means of claim 1, wherein said plurality of tangs is two arched tangs substantially oppositely spaced, said tangs including extremities which mate with the contours of said housing.

4. The snap-on means of claim 3, wherein each of said extremities of said arched tangs include a notch which mates with the contours of said housing.

5. In combination, semiconductor means carried by housing means having a flange, and snap-on means for conducting heat away from said semiconductor, said snap-on means including heat conductive means contoured around and in thermal engagement with said flange and fasteners means retaining said heat conductive means in thermal engagement with said flange, said fastener means including a base biasing said heat conductive means into engagement with said flange and a plurality of tangs engaging and locking with said housing thereby locking said snap-on means to said housing and further biasing said heat conductive means into thermal engagement with said flange.

6. The semiconductor means of claim 5, wherein said housing is substantially cup-shaped with a semiconductor wafer seated in the cup portion of said housing, said flange integral with said cup portion of said housing.

7. The combination of claim 5, wherein said snap-on means is double-locked with said semiconductor means.

8. The snap-on means of claim 5, wherein said tangs are normally arched and include extremities which mate with the contours of said housing.

9. The semiconductor means of claim 5 wherein said flange is substantially circular and includes a plurality of spaced radially extending slots.

10. In combination, a semiconductor means mounted in a threadless cup-shaped housing with a radially slotted and arched flange and snap-on heat sink means including an apertured strip of metal in thermal engagement with and extending beyond said flange, said strip of metal conducting heat away from said semiconductor means, and fastener means locking said strip of metal in engagement with said arched flange, said fastener means including a normally arched base compressively biasing said strip into engagement with said slotted flange so as to substantially flatten portions of said flange and normally arched tangs having notched extremities engaging with and inwardly locking said fastener to said housing and further compressively biasing said strip of metal toward said flange.

References Cited

UNITED STATES PATENTS

| | | | |
|---|---|---|---|
| 3,033,537 | 5/1962 | Brown | 165—80 X |
| 3,146,384 | 8/1964 | Ruehle | 165—80 X |
| 3,229,756 | 1/1966 | Keresftury | 165—80 X |
| 2,712,102 | 6/1955 | Bacon | 317—234 |
| 2,725,505 | 11/1955 | Webster et al. | 317—235 |
| 2,935,666 | 5/1960 | Van Namen | 317—234 |
| 3,195,628 | 7/1965 | McAdam | 165—185 |
| 3,209,218 | 9/1965 | Zielasek et al. | 317—234 X |
| 3,240,263 | 3/1966 | Stewart | 165—80 |

FOREIGN PATENTS

| | | |
|---|---|---|
| 641,272 | 5/1962 | Canada. |

ROBERT A. O'LEARY, *Primary Examiner.*

ALBERT W. DAVIS, Jr., *Assistant Examiner.*